United States Patent
Kumar et al.

(10) Patent No.: US 12,125,705 B2
(45) Date of Patent: Oct. 22, 2024

(54) METHOD FOR PROVIDING DOPED SILICON USING A DIFFUSION BARRIER LAYER

(71) Applicant: Lam Research Corporation, Fremont, CA (US)

(72) Inventors: Purushottam Kumar, Hillsboro, OR (US); Gengwei Jiang, Tigard, OR (US); Bart J. Van Schravendijk, Palo Alto, CA (US); Tengfei Miao, Beaverton, OR (US); Joseph R. Abel, West Linn, OR (US); Adrien Lavoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 463 days.

(21) Appl. No.: 17/441,178

(22) PCT Filed: Mar. 17, 2020

(86) PCT No.: PCT/US2020/023194
§ 371 (c)(1),
(2) Date: Sep. 20, 2021

(87) PCT Pub. No.: WO2020/197864
PCT Pub. Date: Oct. 1, 2020

(65) Prior Publication Data
US 2022/0165563 A1   May 26, 2022

Related U.S. Application Data

(60) Provisional application No. 62/822,423, filed on Mar. 22, 2019.

(51) Int. Cl.
H01L 21/225   (2006.01)
H01L 21/02    (2006.01)

(52) U.S. Cl.
CPC .... *H01L 21/2256* (2013.01); *H01L 21/02164* (2013.01); *H01L 21/022* (2013.01);
(Continued)

(58) Field of Classification Search
None
See application file for complete search history.

(56) References Cited

U.S. PATENT DOCUMENTS 3,798,081 A * 3/1974 Beyer ................. H01L 21/2255
                                                  438/560
4,577,393 A * 3/1986 Schmidt ............ H01L 31/02168
                                                  136/255

(Continued)

FOREIGN PATENT DOCUMENTS

GB      1464734 A      2/1977
KR    10-0305124      11/2001

(Continued)

OTHER PUBLICATIONS

International Search Report from International Application No. PCT/US2020/023194 dated Oct. 1, 2020.

(Continued)

*Primary Examiner* — Scott B Geyer
(74) *Attorney, Agent, or Firm* — Alleman Hall & Tuttle LLP

(57) ABSTRACT

A method for doping a substrate is provided. A silicon oxide diffusion barrier layer is formed on a surface of the substrate. At least one dopant layer is deposited over the silicon oxide diffusion barrier layer. A cap layer is deposited over the at least one dopant layer forming a stack of the substrate, the silicon oxide diffusion layer, the at least one dopant layer, and the cap layer. The stack is annealed. The cap layer, at least one dopant layer, and the silicon oxide diffusion barrier layer are removed.

20 Claims, 6 Drawing Sheets

(52) U.S. Cl.
CPC .... *H01L 21/0228* (2013.01); *H01L 21/02321* (2013.01); *H01L 21/2257* (2013.01)

(56) References Cited

U.S. PATENT DOCUMENTS

| | | | |
|---|---|---|---|
| 5,141,895 A | 8/1992 | Pfiester et al. | |
| 5,350,709 A * | 9/1994 | Harada | H01L 29/0891 |
| | | | 257/E21.135 |
| 5,877,072 A * | 3/1999 | Andideh | H01L 21/2255 |
| | | | 257/E21.279 |
| 5,899,704 A * | 5/1999 | Schlosser | H01L 31/1804 |
| | | | 438/98 |
| 6,448,105 B1 * | 9/2002 | Sterk | H01L 21/2256 |
| | | | 438/97 |
| 8,569,158 B2 * | 10/2013 | Clark | H01L 21/2254 |
| | | | 257/E21.135 |
| 8,877,620 B2 * | 11/2014 | Clark | H01L 21/2255 |
| | | | 257/E21.135 |
| 9,076,646 B2 | 7/2015 | Sims et al. | |
| 9,607,837 B1 * | 3/2017 | Namba | H01L 21/02219 |
| 2002/0155708 A1 * | 10/2002 | Lo | H01L 21/022 |
| | | | 257/E21.228 |
| 2003/0161951 A1 * | 8/2003 | Yuan | H01L 21/31612 |
| | | | 257/E21.279 |
| 2006/0134856 A1 * | 6/2006 | Cho | H01L 21/02312 |
| | | | 438/933 |
| 2009/0250793 A1 | 10/2009 | Sokolov | |
| 2011/0062560 A1 | 3/2011 | Sokolov | |
| 2012/0238074 A1 | 9/2012 | Santhanam et al. | |
| 2012/0252196 A1 * | 10/2012 | Clark | H01L 29/517 |
| | | | 257/E21.135 |
| 2013/0040447 A1 * | 2/2013 | Swaminathan | H01L 21/02274 |
| | | | 257/E21.144 |
| 2013/0115763 A1 * | 5/2013 | Takamure | H01L 21/324 |
| | | | 438/513 |
| 2013/0220989 A1 | 8/2013 | Pease et al. | |
| 2014/0113457 A1 | 4/2014 | Sims et al. | |
| 2016/0260611 A1 * | 9/2016 | Consiglio | H01L 21/2254 |
| 2017/0018420 A1 * | 1/2017 | Kato | H01L 21/02129 |
| 2018/0033622 A1 * | 2/2018 | Swaminathan | H01L 21/02274 |
| 2018/0190793 A1 * | 7/2018 | Profijt | H01L 21/2256 |
| 2018/0315818 A1 * | 11/2018 | Hu | H01L 21/823481 |
| 2019/0139757 A1 * | 5/2019 | Peng | H01L 21/02216 |
| 2019/0164767 A1 * | 5/2019 | Hong | H01L 21/02178 |

FOREIGN PATENT DOCUMENTS

| | | |
|---|---|---|
| KR | 20170021210 A | 2/2017 |
| TW | 201144475 A | 12/2011 |
| WO | 2014/109639 | 7/2014 |

OTHER PUBLICATIONS

Written Opinion from International Application No. PCT/US2020/023194 dated Oct. 1, 2020.

Taiwan Intellectual Property Office, Office Action and Search Report Issued in Application No. 109109406, Apr. 19, 2024, 10 pages.

* cited by examiner

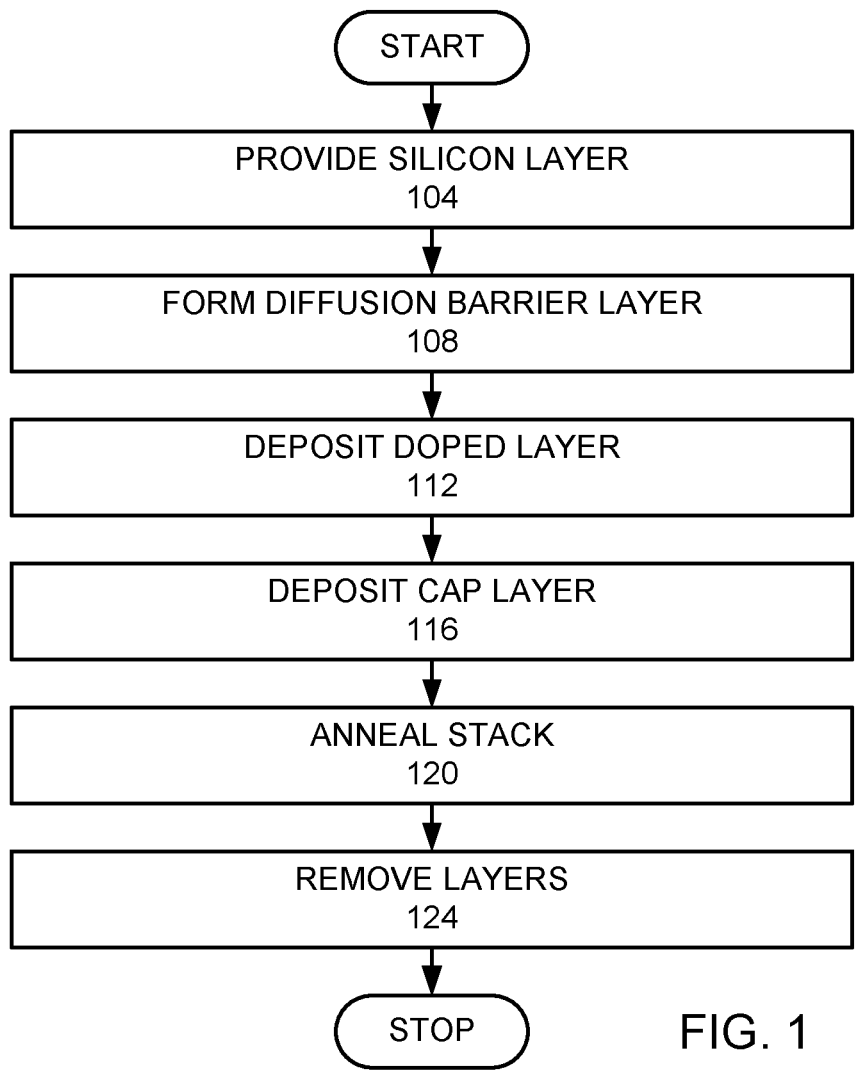

METHOD FOR PROVIDING DOPED SILICON USING A DIFFUSION BARRIER LAYER

CROSS-REFERENCE TO RELATED APPLICATION

This application claims the benefit of priority of U.S. Application No. 62/822,423, filed Mar. 22, 2019, which is incorporated herein by reference for all purposes.

BACKGROUND

The present disclosure relates to the formation of semiconductor devices. More specifically, the disclosure relates to the formation of semiconductor devices with a doped silicon region.

In the formation of semiconductor devices, a substrate, such as a silicon substrate, may be doped with dopants. Sometimes a uniform doping profile is used. Other times a non-uniform doping profile is used.

SUMMARY

To achieve the foregoing and in accordance with the purpose of the present disclosure, a method for doping a substrate is provided. A silicon oxide diffusion barrier layer is formed on a surface of the substrate. At least one dopant layer is deposited over the silicon oxide diffusion barrier layer. A cap layer is deposited over the at least one dopant layer forming a stack of the substrate, the silicon oxide diffusion layer, the at least one dopant layer, and the cap layer. The stack is annealed. The cap layer, the at least one dopant layer, and the silicon oxide diffusion barrier layer are removed.

These and other features of the present disclosure will be described in more detail below in the detailed description of the disclosure and in conjunction with the following figures.

BRIEF DESCRIPTION OF THE DRAWINGS

The present disclosure is illustrated by way of example, and not by way of limitation, in the figures of the accompanying drawings and in which like reference numerals refer to similar elements and in which:

FIG. 1 is a flow chart of an embodiment.

DETAILED DESCRIPTION

The present disclosure will now be described in detail with reference to a few preferred embodiments thereof as illustrated in the accompanying drawings. In the following description, numerous specific details are set forth in order to provide a thorough understanding of the present disclosure. It will be apparent, however, to one skilled in the art, that the present disclosure may be practiced without some or all of these specific details. In other instances, well-known process steps and/or structures have not been described in detail in order to not unnecessarily obscure the present disclosure.

The deposition of a boron silicate glass (BSG) film uses a nanolaminate stack of boron oxide ($B_2O_3$) and silicon oxide ($SiO_2$) and adds a capping oxide at the top to prevent out-diffusion. An uncontrolled interface oxide is formed during boron oxide and $SiO_2$ deposition due to the interaction of oxidizing plasma with the silicon substrate. This typically leads to a lower thickness of interface oxide at the edges of the silicon substrate leading to higher boron diffusion.

Figure 2A:
FIGS. 2A-F are schematic cross-sectional views of a substrate processed according to an embodiment.

In order to facilitate understanding of an embodiment, FIG. 1 is a flow chart of an embodiment. A substrate is provided (step 104). FIG. 2A is a cross-sectional schematic view of a substrate 200 in an embodiment. The substrate 200 may be polysilicon formed over other layers.

Figure 3A:
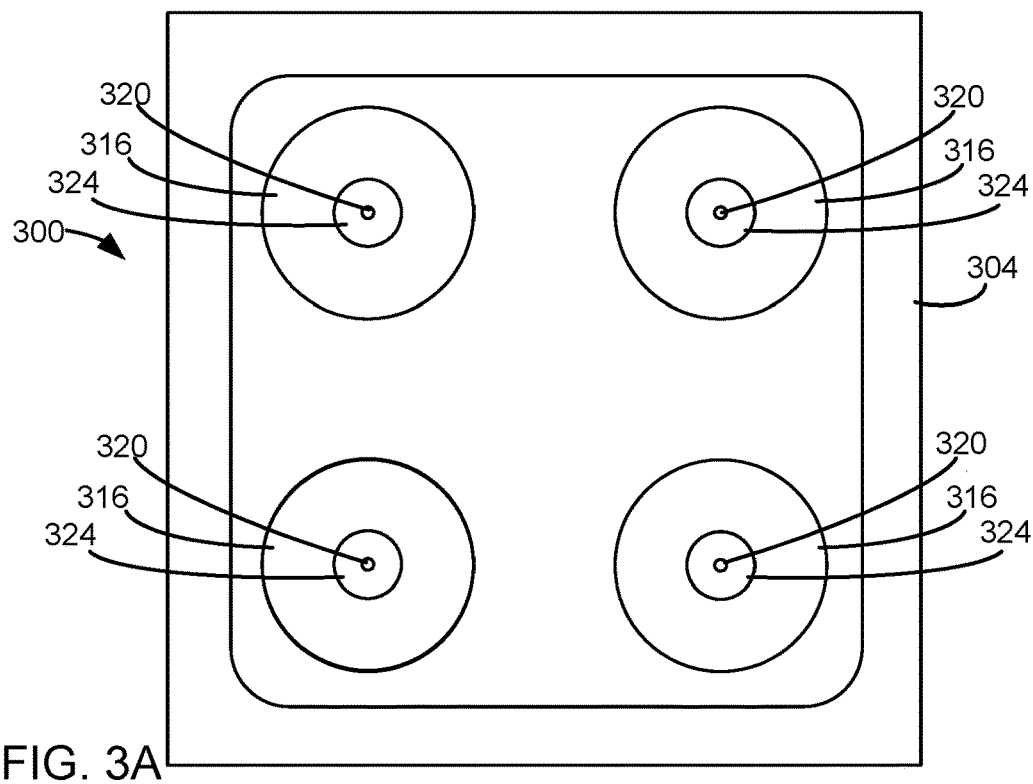
FIG. 3A is a schematic top cut-away view of a process chamber that may be used in an embodiment.
Figure 3B:
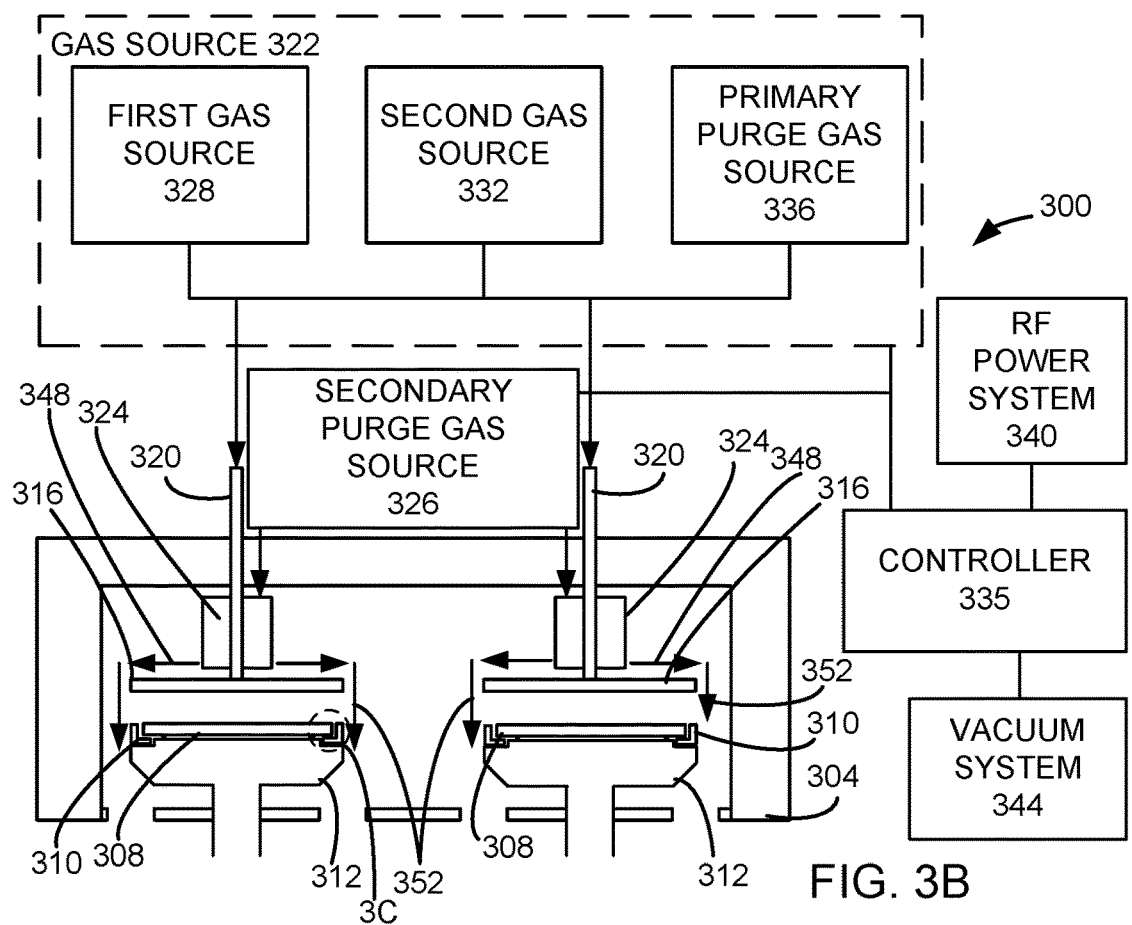
FIG. 3B is a cut-away schematic side view of the embodiment shown in FIG. 3A.

A silicon oxide diffusion barrier layer is formed on a surface of the substrate 200. In this embodiment, an atomic layer deposition (ALD) process is used to deposit a silicon oxide deposition layer. FIG. 3A is a cut-away top schematic view of a processing chamber 300 with four processing stations that may be used for the atomic layer deposition process. FIG. 3B is a cut-away schematic side view of the processing chamber 300, shown in FIG. 3A. The processing chamber 300 has a chamber wall 304. Within the chamber wall 304, are located four processing stations. Each processing station comprises a pedestal 312 acting as a substrate support for supporting a wafer 308, a showerhead 316 for providing gas to the wafer 308 below the showerhead 316, and a manifold 320 connecting the showerhead 316 to a gas source 322. In this embodiment, the gas source 322 comprises a first gas source 328, a second gas source 332, and a primary purge gas source 336. A secondary purge gas outlet 324 is in fluid connection with a secondary purge gas source 326. In this embodiment, the secondary purge gas outlet 324 is in the shape of a cylindrical collar surrounding the manifold 320. The cylindrical collar has apertures to allow the secondary purge gas to flow outwardly in a radial direction over the top of the showerhead 316. A carrier ring 310 surrounds the wafer 308. Part of the carrier ring 310 is below the wafer 308. The carrier ring 310 may be a dielectric ceramic material, such as aluminum oxide. The carrier ring 310 may be used to move the wafer 308 into and out of the processing chamber 300 and between various chambers. A controller 335 is controllably connected to the gas source 322, the secondary purge gas source 326, a radio frequency (RF) power system 340, and a vacuum system 344. An example of such a chamber is the Striker® Oxide system manufactured by Lam Research Corporation of Fremont, CA The substrate 200 is formed over the wafer 308 in a stack.

Figure 4:
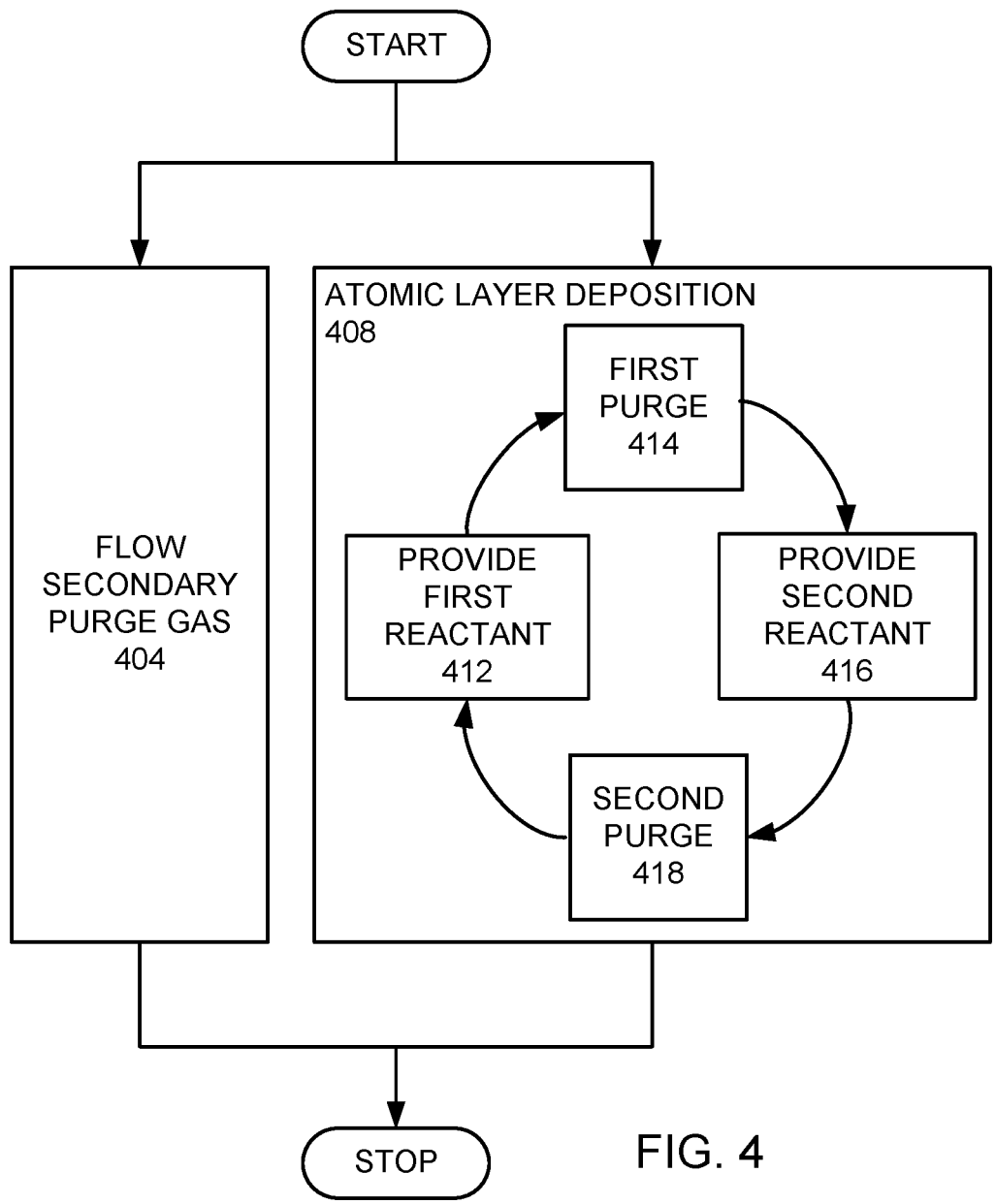
FIG. 4 is a flow chart of a more detailed view of an atomic layer deposition process.

FIG. 4 is a flow chart of an atomic layer deposition process for forming the silicon oxide diffusion barrier. A flow of a secondary purge gas is provided (step 404). In this example, the secondary purge gas is oxygen ($O_2$). Oxygen is the at least one component gas of the secondary purge gas. The secondary purge gas 348 flows from the secondary purge gas outlets 324 over the top of the showerheads 316 to form a secondary purge gas curtain 352 around the outer edges of the showerheads 316.

Simultaneously with the flow of the secondary purge gas (step 404), an atomic layer deposition process (step 408) is provided, which deposits an ALD layer. The atomic layer deposition process (step 408) comprises a plurality of cycles, where each cycle comprises providing a first reactant gas (step 412), purging the first reactant gas (step 414), providing a second reactant gas (step 416), and purging the second reactant gas (step 418). An example of a recipe for the atomic layer deposition process (step 408) provides a first reactant gas, such as 400 sccm aminosilane (step 412). A silicon containing precursor layer is deposited. After 0.4 seconds, the flow of the first reactant gas through the showerheads 316 is stopped. A first purge gas is flowed to the stations through the showerheads 316 (step 414). In this example, the first purge gas is argon (Ar). The flow of the first purge gas is stopped. A second reactant gas is flowed into the process chamber through the showerheads 316 (step 416). In this example, the second reactant gas is oxygen free and comprises an inert gas, such as 13,000 sccm Ar. The second reactant gas is transformed into a plasma. In this example, 100 to 500 watts of RF power are provided at a frequency of 13.56 (megahertz) MHz. The plasma from the second reactant gas and the secondary purge gas transforms the deposited silicon containing precursor layer into silicon oxide, which is part of the ALD layer. After 0.25 seconds, the flow of the second reactant gas into the process chamber is stopped. A purge gas is flowed into the process chamber to purge the second reactant gas (step 418). The flow of the second purge gas is stopped. The cycle then repeats from the step of flowing the precursor gas into the process chamber. The cycle is repeated until the silicon oxide diffusion layer is completed.

Figure 2B:

FIG. 2B is a cross-sectional schematic view of a substrate 200 after a silicon oxide diffusion barrier layer 204 has been deposited. It has been unexpectedly found that by not providing oxygen through the showerheads and providing oxygen in the flow of the secondary purge gas a silicon oxide diffusion barrier layer 204 is formed that is thicker around an outer edge of the substrate 200 than over the center of the substrate 200.

Figure 2C:
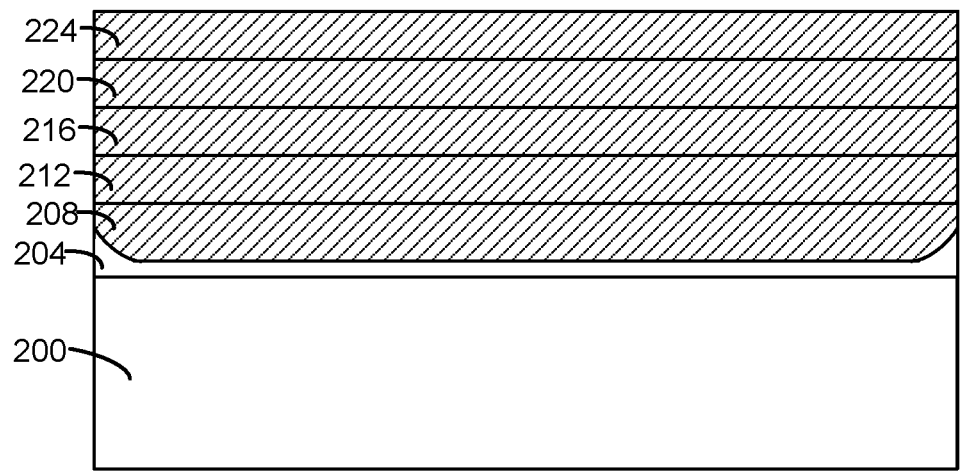

Next, at least one dopant layer is deposited over the silicon oxide diffusion barrier layer 204 (step 112). In this example, five dopant layers are formed over the silicon oxide diffusion barrier layer 204. FIG. 2C is a cross-sectional schematic view of a substrate 200 after five dopant layers are formed over the silicon oxide diffusion barrier layer 204. In this example, the five dopant layers are a first boron containing layer 208, a second boron containing layer 212, a third boron containing layer 216, a fourth boron containing layer 220, and a fifth boron containing layer 224. In this embodiment, the first boron containing layer 208, the second boron containing layer 212, the third boron containing layer 216, the fourth boron containing layer 220, and the fifth boron containing layer 224 are boron oxide layers. The shading indicates the presence of boron. The first boron containing layer 208, the second boron containing layer 212, the third boron containing layer 216, the fourth boron containing layer 220, and the fifth boron containing layer 224 may be deposited by an ALD process.

Such an ALD process may flow a first dopant reactant gas comprising trimethylborate (TMB). The first dopant reactant gas is formed into a plasma to deposit a boron containing precursor layer. After a purge of the first dopant reactant gas, a second dopant reactant gas comprising oxygen is flowed. The second dopant reactant gas is formed into a plasma in order to form a boron oxide layer from the boron containing precursor layer. The process is repeated a plurality of cycles. In other embodiments, the first boron containing layer 208, the second boron containing layer 212, the third boron containing layer 216, the fourth boron containing layer 220, and the fifth boron containing layer 224 may be formed by a plasma enhanced atomic layer deposition (PEALD) process, a plasma enhanced chemical vapor deposition process (PECVD), or a chemical vapor deposition (CVD) process. In other embodiments, other similar processes may be used to deposit the first boron containing layer 208, the second boron containing layer 212, the third boron containing layer 216, the fourth boron containing layer 220, and the fifth boron containing layer 224.

Figure 2D:
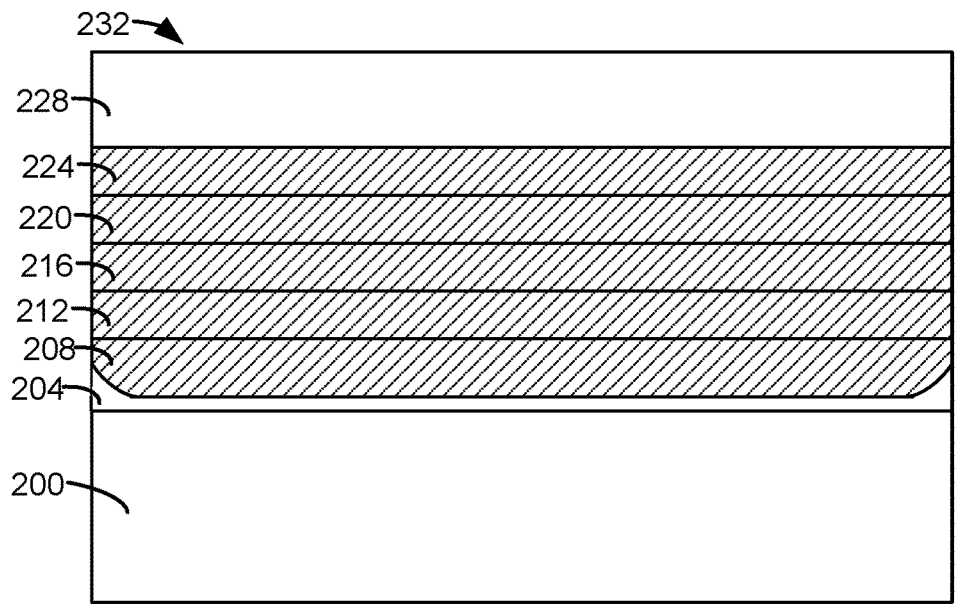

A cap layer is deposited over the dopant layers (step 116). In this embodiment, the cap layer is deposited by at least one of a PEALD process, an ALD process, a PECVD, or a CVD process. In this embodiment, the cap layer is a silicon oxide cap layer. In other embodiments, other similar processes may be used to deposit the cap layer. FIG. 2D is a cross-sectional schematic view of a substrate 200 after the cap layer 228 has been deposited forming a stack 232. Preferably, the cap layer 228 is dense enough to limit the outdiffusion of dopant from the stack 232.

Figure 2E:
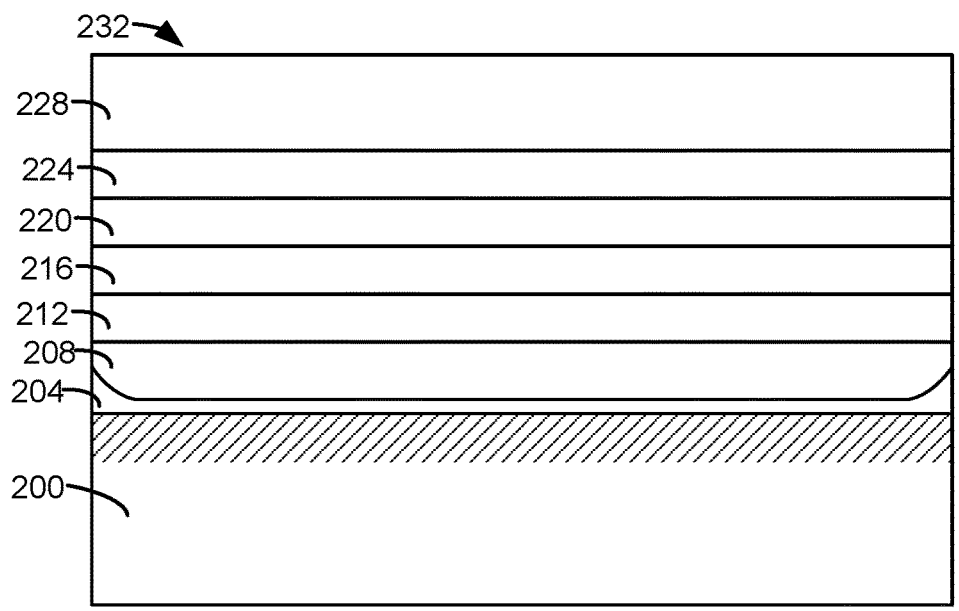

The stack 232 is annealed (step 120). In this example, the annealing is performed by either in situ or by heating in a separate furnace. The stack 232 is heated to a temperature above 700° C. in a nitrogen ($N_2$) or Ar atmosphere. The annealing transfers dopant from the first boron containing layer 208, the second boron containing layer 212, the third boron containing layer 216, the fourth boron containing layer 220, and the fifth boron containing layer 224 through the silicon oxide diffusion barrier layer 204 into the substrate 200. FIG. 2E is a cross-sectional schematic view of the stack 232 after the annealing. The shading indicates the doping of the substrate 200 by boron and also the depletion of boron from the first boron containing layer 208, the second boron containing layer 212, the third boron containing layer 216, the fourth boron containing layer 220, and the fifth boron containing layer 224.

Figure 2F:
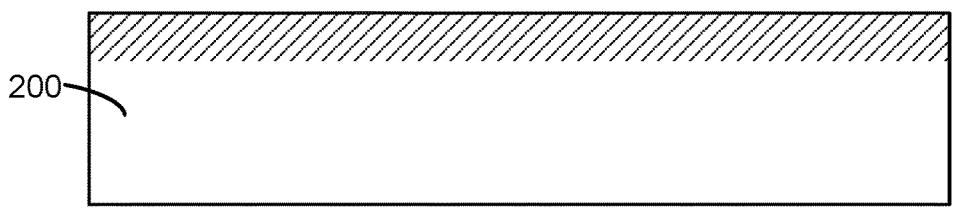

The cap layer 228, the first boron containing layer 208, the second boron containing layer 212, the third boron containing layer 216, the fourth boron containing layer 220, the fifth boron containing layer 224, and the silicon oxide diffusion barrier layer 204 are removed from the stack 232 (step 124). A wet etch using hydrofluoric acid (HF) may be used to remove the cap layer 228, the first boron containing layer 208, the second boron containing layer 212, the third boron containing layer 216, the fourth boron containing layer 220, the fifth boron containing layer 224, and the silicon oxide diffusion barrier layer 204 from the stack 232. FIG. 2F is a cross-sectional schematic view of the stack 232 after the cap layer 228, the first boron containing layer 208, the second boron containing layer 212, the third boron containing layer 216, the fourth boron containing layer 220, the fifth boron containing layer 224, and the silicon oxide diffusion barrier layer 204 have been removed. A doped substrate 200 remains. In this embodiment, the doped substrate 200 is BSG.

By having a separate step of forming the silicon oxide diffusion barrier layer 204 (step 104), the thickness of the silicon oxide diffusion barrier layer 204 may be controlled. The controlled thickness of the silicon oxide diffusion barrier layer 204 provides control over the concentration profile of the dopant of the substrate 200. This embodiment provides a more uniform doping of underlying silicon devices across the wafer. A goal is to have matched performance for each device in every die on the wafer.

Figure 3C:
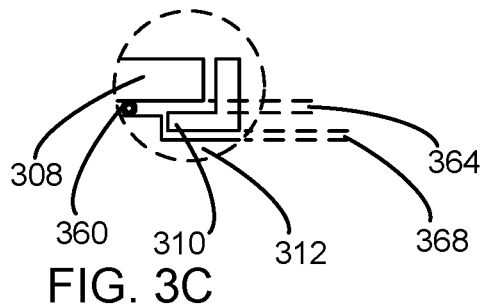
FIG. 3C is an enlarged view of area 3C in FIG. 3B.

FIG. 3C is an enlarged view of area 3C shown in FIG. 3B. A first gap 364 is a distance between the substrate 308 and the carrier ring 310. A second gap 368 is a distance between the carrier ring 310 and the pedestal 312. An O-ring 360 is between the pedestal 312 and the substrate 308. If the first gap 364 is increased to enhance plasma at the edge of the substrate 308, the enhanced plasma causes a lower thickness of the silicon oxide diffusion barrier layer 204 around the edges of the substrate 308 due to densification. In this embodiment, the first gap 364 is reduced, so that the thickness of the silicon oxide diffusion barrier layer 204 is increased around the edge of the substrate 308.

In other embodiments, the depositing at least one dopant layer over the silicon oxide diffusion barrier layer 204 (step 112) deposits a first phosphorous containing layer of phosphorus oxide ($P_2O_5$). The first phosphorous containing layer may be deposited by an ALD process or by the processes described for depositing boron oxide. Other embodiments may deposit an arsenic containing layer to provide an arsenic dopant. In other embodiments, the second dopant reactant gas comprises an inert gas and oxygen. In some embodiments, one region of substrate 200 on a wafer may be doped with boron and another region of the substrate 200 may be doped with another dopant, such as phosphorous or arsenic. In various embodiments, the substrate 200 may be silicon (Si), silicon carbide (SiC), gallium arsenide (GaAs), or gallium nitride (GaN). The substrate 200 may be a wafer or a layer deposited over a wafer.

In another embodiment, a thicker layer of silicon containing precursor layer is deposited near the center of the substrate than the silicon containing precursor layer deposited near the edge of the substrate. In such an embodiment, the deposited silicon oxide diffusion barrier layer 204 is thicker near the center of the substrate 200 than at the edge of the substrate 200.

In another embodiment, the silicon oxide diffusion barrier layer 204 may be formed (step 108) by heating the substrate 200. The substrate 200 is non-uniformly heated so that the thickness of the silicon oxide diffusion barrier layer 204 is non-uniform. For example, the edges around the substrate 200 are heated to a higher temperature than the center of the substrate 200. As a result, the silicon oxide diffusion barrier layer 204 is thicker over the edges of the substrate 200 than the center of the substrate 200. In this example, instead of silicon oxide being deposited on the substrate 200, the silicon oxide is formed from a top surface of the substrate 200. The non-uniform heating of the substrate 200 may be provided by providing nonuniform heating across the pedestal 312. Oxygen is provided during the heating of the silicon to form silicon oxide. In some embodiments, the substrate 200 is heated to a temperature in the range of 200° C. to 900° C. to form the silicon oxide diffusion barrier layer 204. More specifically, the substrate 200 is heated to a temperature in the range of 200° C. to 650° C. to form the silicon oxide diffusion barrier layer 204. Even more specifically, the substrate 200 is heated to a temperature in the range of 200° C. to 400° C. to form the silicon oxide diffusion barrier layer 204.

In various embodiments, the substrate support in the form of a pedestal has multiple heating zones. In an embodiment, the substrate support has more than 20 independently controlled heating zones. The independently controlled heating zones are used to independently heat various parts of the substrate to different temperatures. The zones may be in ring shapes or rectangles or other various shapes and combinations of various shapes. In various embodiments, the independently controlled heating zones may be set to provide a non-uniform temperature distribution across the substrate in order to correct for other non-uniformities resulting in a more uniformly thick silicon oxide diffusion barrier layer 204. The other non-uniformities may be a non-uniform gas flow. The more uniform silicon oxide diffusion barrier layer 204 may be used to provide a more uniform concentration of doping across the substrate 200. In other embodiments, the non-uniform temperature distribution provides a tuned silicon oxide diffusion barrier layer 204 with a non-uniform thickness. The substrate 200 is non-uniformly heated so that a thicker silicon oxide diffusion barrier layer 204 is formed over warmer regions of the substrate 200. In some embodiments, the non-uniform thickness of the silicon oxide diffusion barrier layer 204 may be used to provide a more uniform concentration doping of the substrate 200. In other embodiments, the non-uniform thickness of the silicon oxide diffusion barrier layer 204 may be used to provide a tuned non-uniform concentration doping of the substrate 200. The non-uniform thickness of the silicon oxide diffusion barrier layer 204 may be used to control uniformity of the concentration of the doping.

In exemplary embodiments, the secondary purge gas may comprise $O_2$, $N_2$, Ar, carbon monoxide (CO), carbon dioxide ($CO_2$), ozone ($O_3$), or He. In other exemplary embodiments, the secondary purge gas may be a mixture of $O_2$ and $N_2$ with a flow ratio by number of molecules in a range from 3:1 to 1:3. In other exemplary embodiments, the secondary purge gas may be a mixture of $O_2$ and Ar or He with a flow ratio by number of molecules in a range from 3:1 to 1:3. Other gases that are inert to the ALD process and not ignited by the plasma during the ALD process may be used in other embodiments. Since the secondary purge gas is not ignited by the ALD process and is inert, the secondary purge gas provides isolation between adjacent stations to prevent cross talk.

Figure 5:
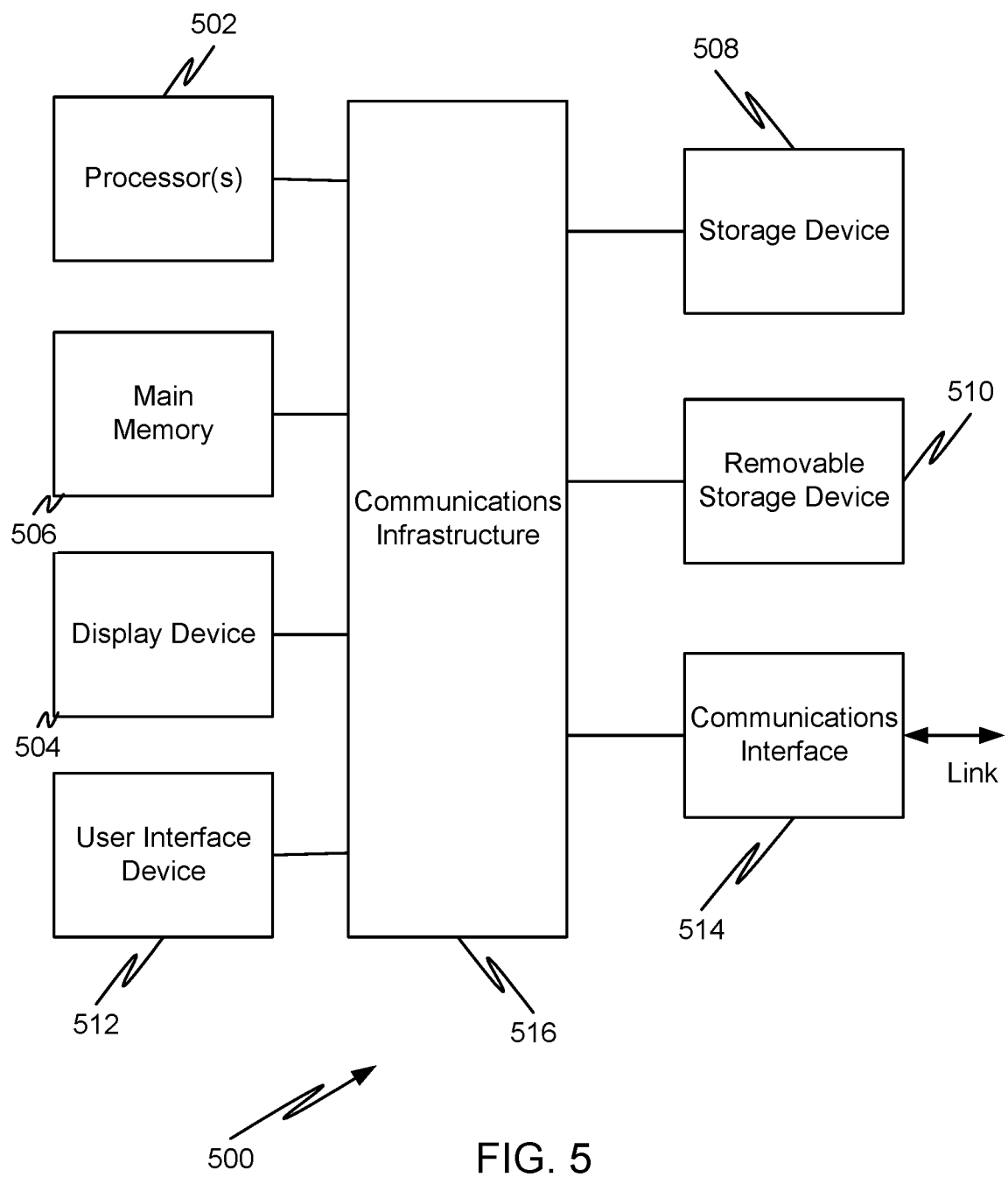
FIG. 5 is a schematic view of a computer system that may be used in practicing an embodiment.

FIG. 5 is a high level block diagram showing a computer system 500, which is suitable for implementing a controller 335 used in embodiments. The computer system may have many physical forms ranging from an integrated circuit, a printed circuit board, and a small handheld device up to a huge supercomputer. The computer system 500 includes one or more processors 502, and further can include an electronic display device 504 (for displaying graphics, text, and other data), a main memory 506 (e.g., random access memory (RAM)), storage device 508 (e.g., hard disk drive), removable storage device 510 (e.g., optical disk drive), user interface devices 512 (e.g., keyboards, touch screens, keypads, mice or other pointing devices, etc.), and a communications interface 514 (e.g., wireless network interface). The communications interface 514 allows software and data to be transferred between the computer system 500 and external devices via a link. The system may also include a communications infrastructure 516 (e.g., a communications bus, cross-over bar, or network) to which the aforementioned devices/modules are connected.

Information transferred via communications interface 514 may be in the form of signals such as electronic, electromagnetic, optical, or other signals capable of being received by communications interface 514, via a communication link that carries signals and may be implemented using wire or cable, fiber optics, a phone line, a cellular phone link, a radio frequency link, and/or other communication channels. With such a communications interface, it is contemplated that the one or more processors 502 might receive information from a network, or might output information to the network in the course of performing the above-described method steps. Furthermore, method embodiments may execute solely upon the processors or may execute over a network such as the Internet, in conjunction with remote processors that share a portion of the processing.

The term "non-transient computer readable medium" is used generally to refer to media such as main memory, secondary memory, removable storage, and storage devices, such as hard disks, flash memory, disk drive memory, CD-ROM, and other forms of persistent memory and shall not be construed to cover transitory subject matter, such as carrier waves or signals. Examples of computer code include machine code, such as produced by a compiler, and files containing higher-level code that are executed by a computer using an interpreter. Computer readable media may also be computer code transmitted by a computer data signal embodied in a carrier wave and representing a sequence of instructions that are executable by a processor.

While this disclosure has been described in terms of several preferred embodiments, there are alterations, modifications, permutations, and various substitute equivalents, which fall within the scope of this disclosure. It should also be noted that there are many alternative ways of implementing the methods and apparatuses of the present disclosure. It is therefore intended that the following appended claims be interpreted as including all such alterations, modifications, permutations, and various substitute equivalents as fall within the true spirit and scope of the present disclosure.

What is claimed is:

1. A method for doping a substrate, comprising:
   forming a silicon oxide diffusion barrier layer on a surface of the substrate, wherein the silicon oxide diffusion barrier layer has a non-uniform thickness to control uniformity of concentration of doping of the substrate;
   depositing at least one dopant layer over the silicon oxide diffusion barrier layer;
   depositing a cap layer over the at least one dopant layer forming a stack of the substrate, the silicon oxide diffusion barrier layer, the at least one dopant layer, and the cap layer;
   annealing the stack; and
   removing the cap layer, the at least one dopant layer, and the silicon oxide diffusion barrier layer.

2. The method, as recited in claim 1, wherein the substrate has an outer edge and center and wherein the silicon oxide diffusion barrier layer is thicker over the outer edge of the substrate than over the center of the substrate.

3. The method, as recited in claim 2, wherein forming the silicon oxide diffusion barrier layer comprises heating the substrate, wherein the outer edge of the substrate is heated to a temperature greater than a temperature of the center of the substrate.

4. The method, as recited in claim 1, wherein forming the silicon oxide diffusion barrier layer comprises providing an atomic layer deposition process.

5. The method, as recited in claim 4, wherein the atomic layer deposition process comprises a plurality of cycles, wherein each cycle comprises:
   flowing a first reactant gas comprising a silicon containing precursor; depositing a silicon containing precursor layer;
   stopping the flow of the first reactant gas;
   flowing a second reactant gas;
   providing an RF power to transform the second reactant gas into a plasma;
   transforming the silicon containing precursor layer to silicon oxide; and
   stopping the flow of the second reactant gas.

6. The method, as recited in claim 5, wherein the substrate is located below a showerhead in a processing chamber, wherein flowing the second reactant gas flows the second reactant gas from the showerhead, further comprising flowing a secondary purge gas comprising oxygen from outside of the showerhead in the processing chamber forming a curtain around an outer edge of the showerhead, wherein the second reactant gas is oxygen free.

7. The method, as recited in claim 5, wherein the substrate is located below a showerhead in a processing chamber, wherein flowing the second reactant gas flows the second reactant gas from the showerhead, further comprising flowing a secondary purge gas comprising oxygen from outside of the showerhead in the processing chamber forming a curtain around an outer edge of the showerhead, wherein the second reactant gas comprises an inert gas and oxygen.

8. The method, as recited in claim 5, wherein more silicon containing precursor is deposited near a center of the substrate than outer edges of the substrate.

9. The method, as recited in claim 1, wherein the dopant layer comprises a dopant of at least one of boron, phosphorous, and arsenic.

10. The method, as recited in claim 1, wherein the substrate is made of at least one of Si, SiC, GaAs, or GaN.

11. The method, as recited in claim 1, wherein the substrate is supported over a substrate support, wherein forming the silicon oxide diffusion barrier layer comprises nonuniformly heating the substrate support to create warmer regions of the substrate support in order to non-uniformly heat the substrate to create warmer regions of the substrate, wherein the silicon oxide diffusion barrier layer is formed to be thicker over the warmer regions of the substrate.

12. A method for doping a substrate, comprising:
   forming a silicon oxide diffusion barrier layer on a surface of the substrate, wherein the silicon oxide diffusion barrier layer is thicker over an outer edge of the substrate than over a center of the substrate;
   depositing at least one dopant layer over the silicon oxide diffusion barrier layer;
   depositing a cap layer over the at least one dopant layer forming a stack of the substrate, the silicon oxide diffusion barrier layer, the at least one dopant layer, and the cap layer;
   annealing the stack; and
   removing the cap layer, the at least one dopant layer, and the silicon oxide diffusion barrier layer.

13. The method, as recited in claim 12, wherein forming the silicon oxide diffusion barrier layer comprises heating the substrate, wherein the outer edge of the substrate is heated to a temperature greater than a temperature of the center of the substrate.

14. The method, as recited in claim 12, wherein forming the silicon oxide diffusion barrier layer comprises providing an atomic layer deposition process.

15. A method for doping a substrate, comprising:
   forming a silicon oxide diffusion barrier layer on a surface of the substrate by an atomic layer deposition process comprising a plurality of cycles, each cycle comprising
      flowing a first reactant gas comprising a silicon containing precursor to deposit a silicon containing precursor layer on the substrate,
      stopping the flow of the first reactant gas,
      flowing a second reactant gas,
      providing an RF power to transform the second reactant gas into a plasma,
      transforming the silicon containing precursor layer on the substrate to silicon oxide, and
      stopping the flow of the second reactant gas;
   depositing at least one dopant layer over the silicon oxide diffusion barrier layer;

depositing a cap layer over the at least one dopant layer forming a stack of the substrate, the silicon oxide diffusion barrier layer, the at least one dopant layer, and the cap layer;

annealing the stack; and removing the cap layer, the at least one dopant layer, and the silicon oxide diffusion barrier layer.

16. The method, as recited in claim 15, wherein the substrate is located below a showerhead in a processing chamber, wherein flowing the second reactant gas comprises flowing the second reactant gas from the showerhead, and further comprising flowing a secondary purge gas comprising oxygen from outside of the showerhead in the processing chamber to form a curtain of the secondary purge gas around an outer edge of the showerhead, wherein the second reactant gas is oxygen free.

17. The method, as recited in claim 15, wherein the substrate is located below a showerhead in a processing chamber, wherein flowing the second reactant gas comprises flowing the second reactant gas from the showerhead, and further comprising flowing a secondary purge gas comprising oxygen from outside of the showerhead in the processing chamber to form a curtain around an outer edge of the showerhead, wherein the second reactant gas comprises an inert gas and oxygen.

18. The method, as recited in claim 15, wherein the dopant layer comprises a dopant of at least one of boron, phosphorous, and arsenic, and wherein the substrate is made of at least one of Si, SiC, GaAs, or GaN.

19. The method, as recited in claim 15, wherein the substrate is supported by a substrate support, wherein forming the silicon oxide diffusion barrier layer comprises non-uniformly heating the substrate support to create warmer regions of the substrate support in order to non-uniformly heat the substrate to create warmer regions of the substrate, and wherein the silicon oxide diffusion barrier layer is formed to be thicker over the warmer regions of the substrate.

20. The method, as recited in claim 15, wherein the substrate is supported by a substrate support, wherein forming the silicon oxide diffusion barrier layer comprises non-uniformly heating the substrate support to create warmer regions of the substrate support in order to non-uniformly heat the substrate to create warmer regions of the substrate, and wherein the silicon oxide diffusion barrier layer is formed to be uniform over the substrate.

* * * * *